United States Patent
Lee

(10) Patent No.: US 9,397,113 B2
(45) Date of Patent: Jul. 19, 2016

(54) MEMORY ARCHITECTURE OF ARRAY WITH SINGLE GATE MEMORY DEVICES

(71) Applicant: MACRONIX INTERNATIONAL CO., LTD., Hsinchu (TW)

(72) Inventor: Guanru Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/581,064

(22) Filed: Dec. 23, 2014

(65) Prior Publication Data
US 2016/0181270 A1    Jun. 23, 2016

(51) Int. Cl.
*H01L 29/76* (2006.01)
*H01L 27/115* (2006.01)

(52) U.S. Cl.
CPC ...... *H01L 27/11578* (2013.01); *H01L 27/1157* (2013.01)

(58) Field of Classification Search
CPC .................. H01L 21/8229; H01L 27/1023
See application file for complete search history.

(56) References Cited

U.S. PATENT DOCUMENTS

| 8,163,616 B2 | 4/2012 | Kang et al. |
| 8,363,476 B2 | 1/2013 | Lue et al. |
| 2008/0211007 A1* | 9/2008 | Yuan ................. H01L 27/11521 257/316 |
| 2012/0068241 A1 | 3/2012 | Sakuma et al. |

* cited by examiner

*Primary Examiner* — Elias M Ullah
(74) *Attorney, Agent, or Firm* — Haynes Beffel & Wolfeld LLP

(57) ABSTRACT

A vertical gate nonvolatile NAND array includes a plurality of vertically stacked NAND strings of nonvolatile memory cells, a plurality of word lines arranged orthogonally over the plurality of vertically stacked NAND strings, and a plurality of vertical columns of conductive gate material electrically coupled to the plurality of word lines. The plurality of vertically stacked NAND strings are with vertically stacked semiconductor strips having opposite sides including a first side and a second side. The vertical columns in the plurality of vertical columns are gates to only one side of the first side and the second side of the opposite sides of the vertically stacked semiconductor strips. The vertical columns in the plurality of vertical columns are gates to adjacent stacks in the plurality of vertically stacked NAND strings.

17 Claims, 13 Drawing Sheets

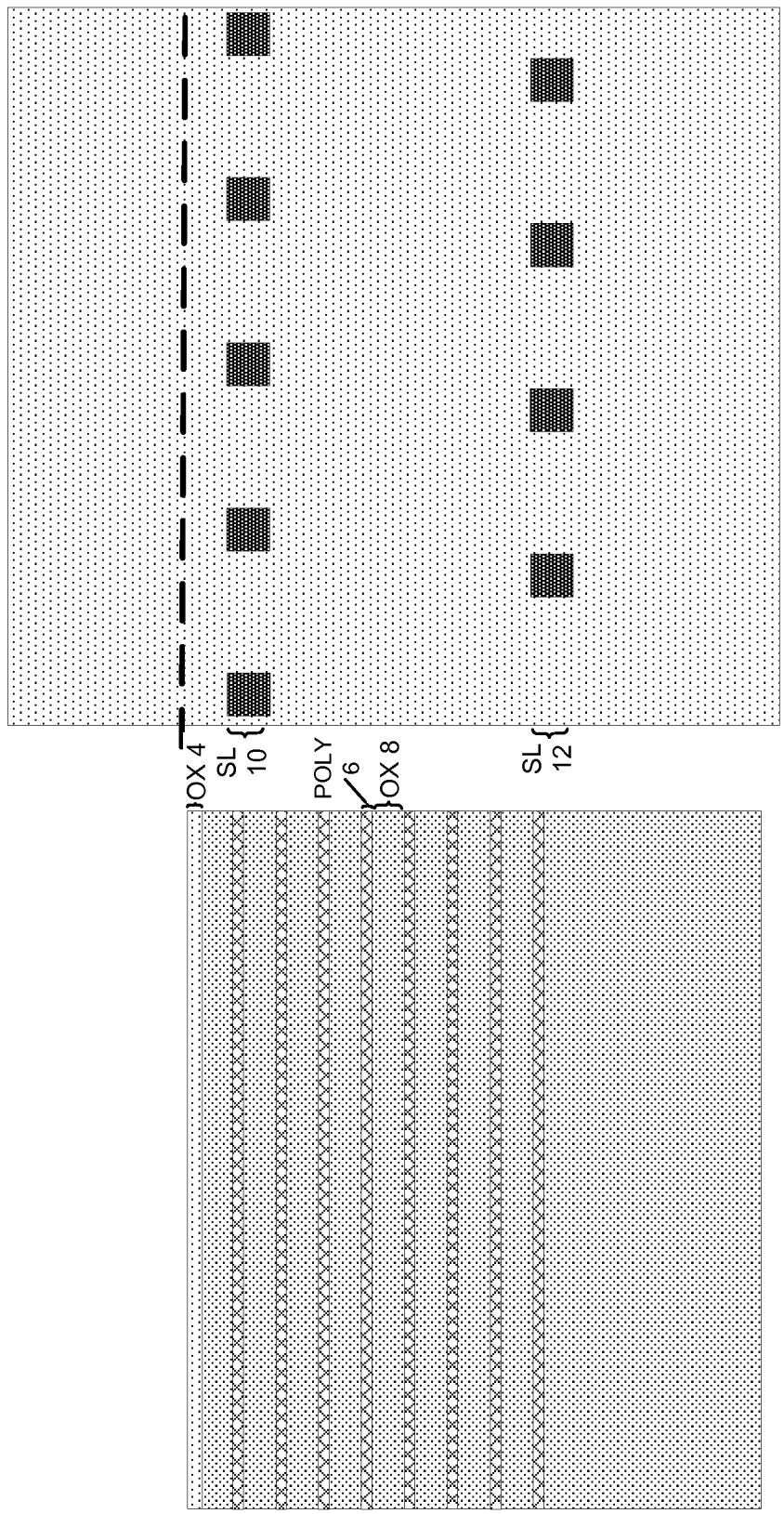

MEMORY ARCHITECTURE OF ARRAY WITH SINGLE GATE MEMORY DEVICES

BACKGROUND OF THE INVENTION

1. Technical Field

The present disclosure relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit.

FIG. 1 is a perspective illustration of an implementation of a three-dimensional (3D) integrated circuit device using a vertical gate structure. The device 100 illustrated in FIG. 1 includes a plurality of stacks of conductive strips alternating with insulating strips in the Z-direction on an integrated circuit substrate.

In the example shown in FIG. 1, a multilayer array is formed on an insulating layer, and includes a plurality of structures of a conductive material, such as a plurality of word lines 125-1 WL through 125-N WL, arranged orthogonally over and conformal with the plurality of stacks. Conductive strips in the stacks of conductive strips in multiple planes (e.g. 112, 113, 114, and 115) can include channels for the memory elements, and structures in the plurality of structures (e.g. 125-1 WL through 125-N WL) can be arranged as word lines and string select lines including vertical gates for memory elements. Conductive strips in the same plane are electrically coupled together by a stack of linking elements (e.g. 102B, 103B, 104B and 105B).

A contact structure including a stack of linking elements 112A, 113A, 114A, and 115A terminate conductive strips, such as the conductive strips 112, 113, 114, and 115 in the plurality of stacks. As illustrated, these linking elements 112A, 113A, 114A, and 115A are electrically connected to different bit lines for connection to decoding circuitry to select planes within the array. These linking elements 112A, 113A, 114A, and 115A can be patterned at the same time that the plurality of stacks is defined.

The stack of linking elements (e.g. 102B, 103B, 104B and 105B) are separated by insulating layers (not shown) in the Z-direction, and terminate conductive strips, such as conductive strips 102, 103, 104, and 105. The insulating layers can include the insulating material as described for the insulating strips between the conductive strips in the Z-direction. A plurality of interlayer connectors (e.g. 172, 173, 174, and 175) in the stack of linking elements (e.g. 102B, 103B, 104B, and 105B) extend from a connector surface to respective linking elements. Patterned conductor lines on top of the connector surface can be connected to respective interlayer connectors. As illustrated, interlayer connectors 172, 173, 174, 175 electrically connect linking elements 102B, 103B, 104B, and 105B to different bit lines in patterned conductor lines, such as a metal layer ML3, for connection to decoding circuitry to select planes within the array. The stack of linking elements 102B, 103B, 104B, and 105B can be patterned at the same time that the plurality of stacks is defined.

Any given stack of conductive strips is coupled to either the stack of linking elements 112A, 113A, 114A, and 115A, or the stack of linking elements 102B, 103B, 104B, and 105B, but not both. The stack of conductive strips 112, 113, 114, and 115 is terminated at one end by the stack of linking elements 112A, 113A, 114A, and 115A, passes through SSL gate structure 119, ground select line GSL 126, word lines 125-1 WL through 125-N WL, ground select line GSL 127, and is terminated at the other end by source line 128. The stack of conductive strips 112, 113, 114, and 115 does not reach the stack of linking elements 102B, 103B, 104B, and 105B.

The stack of conductive strips 102, 103, 104, and 105 is terminated at one end by the stack of linking elements 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of conductive strips 102, 103, 104, and 105 does not reach the stack of linking elements 112A, 113A, 114A, and 115A.

A memory layer is disposed in interface regions at cross-points between surfaces of the conductive strips 112-115 and 102-105 in the plurality of stacks of conductive strips, and the plurality of structures of a conductive material, such as a plurality of word lines 125-1 WL through 125-N WL. In particular, the memory layer is formed on side surfaces of the conductive strips in the plurality of stacks. Memory elements are disposed in interface regions at cross-points between side surfaces of the plurality of stacks and the plurality of word lines. Ground select lines GSL 126 and GSL 127 are conformal with the plurality of stacks, similar to the word lines.

Every stack of conductive strips is terminated at one end by linking elements and at the other end by a source line. For example, the stack of conductive strips 112, 113, 114, and 115 is terminated at one end by linking elements 112A, 113A, 114A, and 115A, and terminated on the other end by a source line 128. At the near end of the figure, every other stack of conductive strips is terminated by the linking elements 102B, 103B, 104B, and 105B, and every other stack of conductive strips is terminated by a separate source line. At the far end of the figure, every other stack of conductive strips is terminated by the linking elements 112A, 113A, 114A, and 115A, and every other stack of conductive strips is terminated by a separate source line.

Bit lines and string select gate structures are formed at the metals layers ML1, ML2, and ML3. Bit lines are coupled to a plane decoder (not shown). String select gate structures are coupled to a string select line decoder (not shown).

The ground select lines GSL 126 and 127 can be patterned during the same step that the word lines 125-1 WL through 125-N WL are defined. Ground select devices are formed at cross-points between surfaces of the plurality of stacks and ground select lines GSL 126 and 127. The SSL gate structures 119 and 109 can be patterned during the same step in which the word lines 125-1 WL through 125-N WL are defined. String select devices are formed at cross-points between surfaces of the plurality of stacks and string select (SSL) gate structures 119 and 109. These devices are coupled to decoding circuitry for selecting the strings within particular stacks in the array.

In the memory device of FIG. 1, the trenches separating adjacent stacks of conductive strips have the same width. Narrowing the distance between adjacent stacks of conductive strips could increase the memory density. However, further narrowing the distance between adjacent stacks of conductive strips increases the difficulty of forming quality memory materials for both stacks, as well as gate material. It would be desirable to increase the memory density of the memory device by narrowing trenches between adjacent stacks of conductive strips, without compromising the quality of the memory material and gate material which is formed inside the trenches.

SUMMARY OF THE INVENTION

One aspect of the technology is a method for manufacturing a nonvolatile memory array, comprising:
  forming a plurality of layers of a semiconductor material alternating with insulating layers on a substrate;
  etching the plurality of layers to define a first plurality of trenches and a second plurality of trenches, the first plurality of trenches and the second plurality of trenches defining a plurality of stacks of strips of the semiconductor material, the first plurality of trenches interleaved with the second plurality of trenches, a first width of the first plurality of trenches being wider than a second width of the second plurality of trenches; and
  forming, in the first plurality of trenches, nonvolatile memory material that stores data as part of nonvolatile memory cells in the nonvolatile memory array.
One embodiment of the technology further comprises:
  filling the second plurality of trenches with insulating material that electrically separates adjacent stacks of the plurality of stacks.
One embodiment of the technology further comprises:
  forming, in the first plurality of trenches, a plurality of vertical columns of conductive gate material that are gates to stacks of the plurality of stacks on first and second opposite sides of trenches of the first plurality of trenches.
In one embodiment of the technology, forming the plurality of vertical columns includes:
  after forming the nonvolatile memory material in the first plurality of trenches, filling the first plurality of trenches with conductive gate material; and
  removing excess parts of the conductive gate material from the first plurality of trenches to form the plurality of vertical columns.
One embodiment of the technology further comprises:
  forming a plurality of word lines orthogonally over the plurality of stacks of strips, the plurality of word lines electrically coupled with the plurality of vertical columns.
In one embodiment of the technology, said etching includes:
  etching the first plurality of trenches and etching the second plurality of trenches in different etches.
In one embodiment of the technology, the first plurality of trenches has a first pitch, the second plurality of trenches has the first pitch, and a combined plurality of trenches including the first plurality of trenches and the second plurality of trenches has a second pitch equal to half of the first pitch.
In one embodiment of the technology, said forming the nonvolatile memory material is performed in only the first plurality of trenches, out of the first plurality of trenches and the second plurality of trenches.

One aspect of the technology is a memory device comprising a vertical gate nonvolatile NAND array. The array includes a plurality of vertically stacked NAND strings of nonvolatile memory cells, a plurality of word lines arranged orthogonally over the plurality of vertically stacked NAND strings, and a plurality of vertical columns of conductive gate material electrically coupled to the plurality of word lines.

The plurality of vertically stacked NAND strings are with vertically stacked semiconductor strips having opposite sides including a first side and a second side. The vertical columns in the plurality of vertical columns are gates to only one side of the first side and the second side of the opposite sides of the vertically stacked semiconductor strips. The vertical columns in the plurality of vertical columns are gates to adjacent stacks in the plurality of vertically stacked NAND strings.

In one embodiment of the technology, a first plurality of distances and a second plurality of distances separate stacks in the plurality of vertically stacked NAND strings. In some cases, these distances separating stacks may have been created by trenches that were subsequently filled in the finished device. The first plurality of distances is interleaved with the second plurality of distances. The first plurality of distances is wider than the second plurality of distances.

In one embodiment of the technology, the first plurality of distances but not the second plurality of distances is occupied by nonvolatile memory material that stores data as part of the nonvolatile memory cells in the vertical gate nonvolatile NAND array. Where the first plurality of distances corresponds to a first plurality of trenches, such trenches were partly filled by the nonvolatile memory material.

In one embodiment of the technology, the first plurality of distances but not the second plurality of distances is occupied by the plurality of vertical columns that are the gates to the plurality of vertically stacked NAND strings. Where the first plurality of distances corresponds to a first plurality of trenches, such trenches were partly filled by the vertical columns.

In one embodiment of the technology, the second plurality of distances is occupied by insulating material that electrically separates adjacent stacks of the plurality of stacks. Where the second plurality of distances corresponds to a second plurality of trenches, such trenches were partly filled by the vertical columns.

One embodiment of the technology further comprises nonvolatile memory material in between the plurality of vertical columns and the vertically stacked semiconductor strips.

In one embodiment of the technology, the adjacent stacks in the plurality of vertically stacked NAND strings include NAND strings of opposite orientations, the opposite orientations including a first orientation of bit line-to-source line and a second orientation of source line-to-bit line.

In one embodiment of the technology, the vertical gate NAND array has memory cells at cross points of (i) the plurality of vertical columns and (ii) the vertically stacked semiconductor strips of the plurality of vertically stacked NAND strings.

One embodiment of the technology further comprises control circuitry that performs memory operations on memory cells in the vertical gate NAND array distinguished by: (i) a particular strip layer in the vertically stacked semiconductor strips, (ii) a particular position along a strip of the vertically stacked semiconductor strips, and (iii) a particular stack in the plurality of vertically stacked NAND strings.

One embodiment of the technology further comprises a first lateral stack of semiconductor strips connected to first ends of the vertically stacked semiconductor strips; and a second lateral stack of semiconductor strips connected to second ends of the vertically stacked semiconductor strips. The first and the second ends are on opposite ends of the vertically stacked semiconductor strips.

In one embodiment of the technology the first lateral stack of semiconductor strips is disconnected from second ends of the vertically stacked semiconductor strips, and the second lateral stack of semiconductor strips is disconnected from first ends of the vertically stacked semiconductor strips.

One embodiment of the technology further comprises a first plurality of bit line pads between the plurality of word lines and one of the first lateral stack of semiconductor strips and the second lateral stack of semiconductor strips.

One embodiment of the technology further comprises control circuitry that distinguishes memory cells in one of the vertically stacked semiconductor strips by applying a bias arrangement to the first plurality of bit line pads.

Yet another aspect of the technology is a method of manufacturing a vertical gate nonvolatile NAND array, including:

providing a plurality of vertically stacked NAND strings of nonvolatile memory cells with vertically stacked semiconductor strips having opposite sides including a first side and a second side;

providing a plurality of word lines arranged orthogonally over the plurality of vertically stacked NAND strings, providing a plurality of vertical columns of conductive gate material electrically coupled to the plurality of word lines, wherein vertical columns in the plurality of vertical columns are gates to only one side of the first side and the second side of the opposite sides of the vertically stacked semiconductor strips, and wherein the vertical columns in the plurality of vertical columns are gates to adjacent stacks in the plurality of vertically stacked NAND strings.

Various embodiments can be a 2D memory array or a 3D memory array.

Other aspects and advantages of the present invention can be seen on review of the drawings, the detailed description and the claims, which follow.

BRIEF DESCRIPTION OF THE DRAWINGS

FIGS. 3-16 are steps in an example process flow to make the 3D memory structure in FIG. 2.

FIGS. 3 and 4 are respectively side and top views of a stack of semiconductor material with oxide separating different layers of semiconductor material, in which source line contacts are formed that go through all layers of the stack of semiconductor material.

FIGS. 5 and 6 are respectively side and top views in which a first set of trenches is formed adjacent to the source line contacts, the trench openings being characterized by first trench distances.

FIGS. 7 and 8 are respectively side and top views in which nonvolatile memory material is formed conformally over the trench surfaces.

FIGS. 9 and 10 are respectively side and top views in which conductive gate material fills the trenches, covering the nonvolatile memory material in the trenches.

FIGS. 11 and 12 are respectively side and top views in which a second set of trenches is formed to interlace with the first set of trenches, the trench openings being characterized by second trench distances narrower than the first trench distances characterizing the trench openings of the first set of trenches.

FIGS. 13 and 14 are respectively side and top views in which the second set of trenches is filled with oxide.

FIGS. 15 and 16 are respectively side and top views in which bit line pads, word lines, and ground select/string select lines, are formed orthogonally over the stacks of semiconductor material.

DETAILED DESCRIPTION

A detailed description of embodiments is provided with reference to the Figures.

Figure 2:
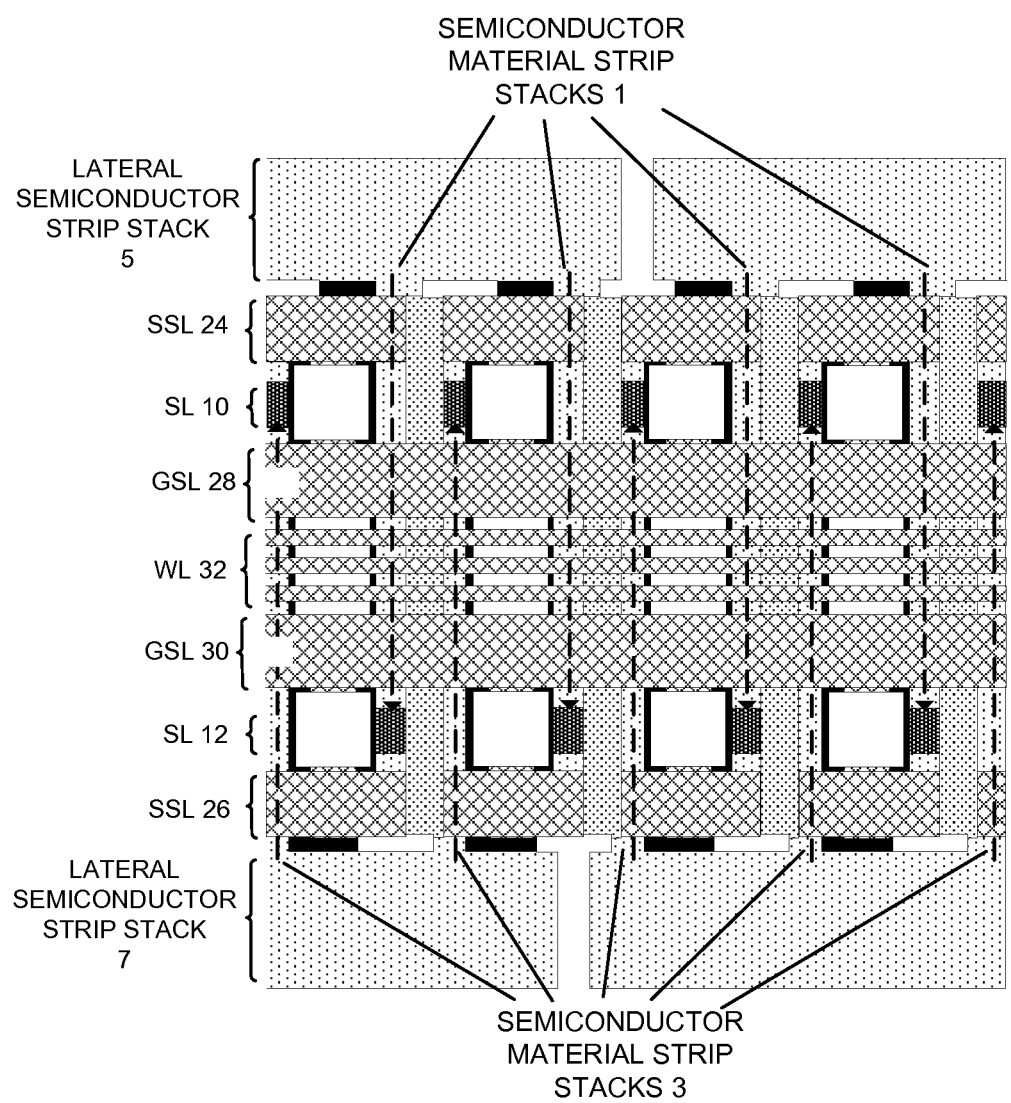
FIG. 2 is a top view of a vertical gate 3D memory structure with stacked NAND strings of nonvolatile memory cells having vertically stacked semiconductor strips, showing directions of current flow from lateral semiconductor strip stacks, through vertically stacked semiconductor strips, and to source line contacts.

FIG. 2 is a top view of a vertical gate 3D memory structure with stacked NAND strings of nonvolatile memory cells having vertically stacked semiconductor strips, showing directions of current flow from lateral semiconductor strip stacks, through vertically stacked semiconductor strips, and to source line contacts. The directions of current flow can be reversed, depending on the conductivity types of the materials and type of sensing.

Semiconductor material strip stacks 1 and 3 are stacks of semiconductor material strips, which can be an even number such as a power of two, or another number of strips. Within each stack, the semiconductor material strips alternate with dielectric strips that electrically isolate adjacent strips from each other. Semiconductor material strip stacks 1 are parallel, semiconductor material strip stacks 3 are parallel, and semiconductor material strip stacks 1 are parallel to semiconductor material strip stacks 3. A typical doping concentration for an embodiment with n-type semiconductor strips can be around $10^{18}/cm^3$, with usable embodiments likely in the range of $10^{17}/cm^3$ to $10^{19}/cm^3$. The use of n-type semiconductor strips can be particularly beneficial in junction-free embodiments to improve conductivity along the NAND strings and thereby allowing higher read current.

Word lines 32 include word lines arranged orthogonally over the semiconductor material strip stacks 1 and 3. Word lines 32 are parallel to each other. Although 3 word lines are shown, other embodiments can include another number of word lines, such as an even number which may be a power of two, or another number of word lines. The word lines are positioned over and electrically connected to vertical columns of gate material that electrically couple to all layers of the semiconductor material strip stacks 1 and 3. A layer of silicide (e.g. tungsten silicide, cobalt silicide, titanium silicide) can cover the top surfaces of the word lines 32.

A 3D array of memory elements is established at crosspoints between surfaces of the semiconductor material strip stacks 1 and 3 and the vertical columns of gate material. Memory elements at a particular location along the semiconductor material strip stacks 1 and 3 are selected by applying a set of voltages to the word lines 32 that distinguishes one word line from the other word lines. The vertical columns can be referred to as vertical gates, because of their vertical orientation running up and down the sides of the semiconductor material strip stacks 1 and 3.

Lateral semiconductor strip stacks 5 and 7 are also stacks of semiconductor material strips. Within each stack, the semiconductor material strips alternate with dielectric strips that electrically isolate adjacent strips from each other. The same vertical position is shared by semiconductor material strips in layers of lateral semiconductor strip stacks 5 and 7 and semiconductor material strips in layers of semiconductor material strip stacks 1 and 3. Semiconductor material strips in lateral semiconductor strip stacks 5 and 7, and semiconductor material strips in layers of semiconductor material strip stacks 1 and 3 which are positioned in the same layer can be electrically coupled together.

Semiconductor material strip stacks 1 and 3 have opposite first and second ends. With semiconductor material strip stacks 1, the first ends are electrically coupled to lateral semiconductor strip stack 5 and electrically decoupled from lateral semiconductor strip stack 7. With semiconductor material strip stacks 3, the first ends are electrically decoupled from lateral semiconductor strip stack 5 and electrically coupled to lateral semiconductor strip stack 7.

Figure 1:
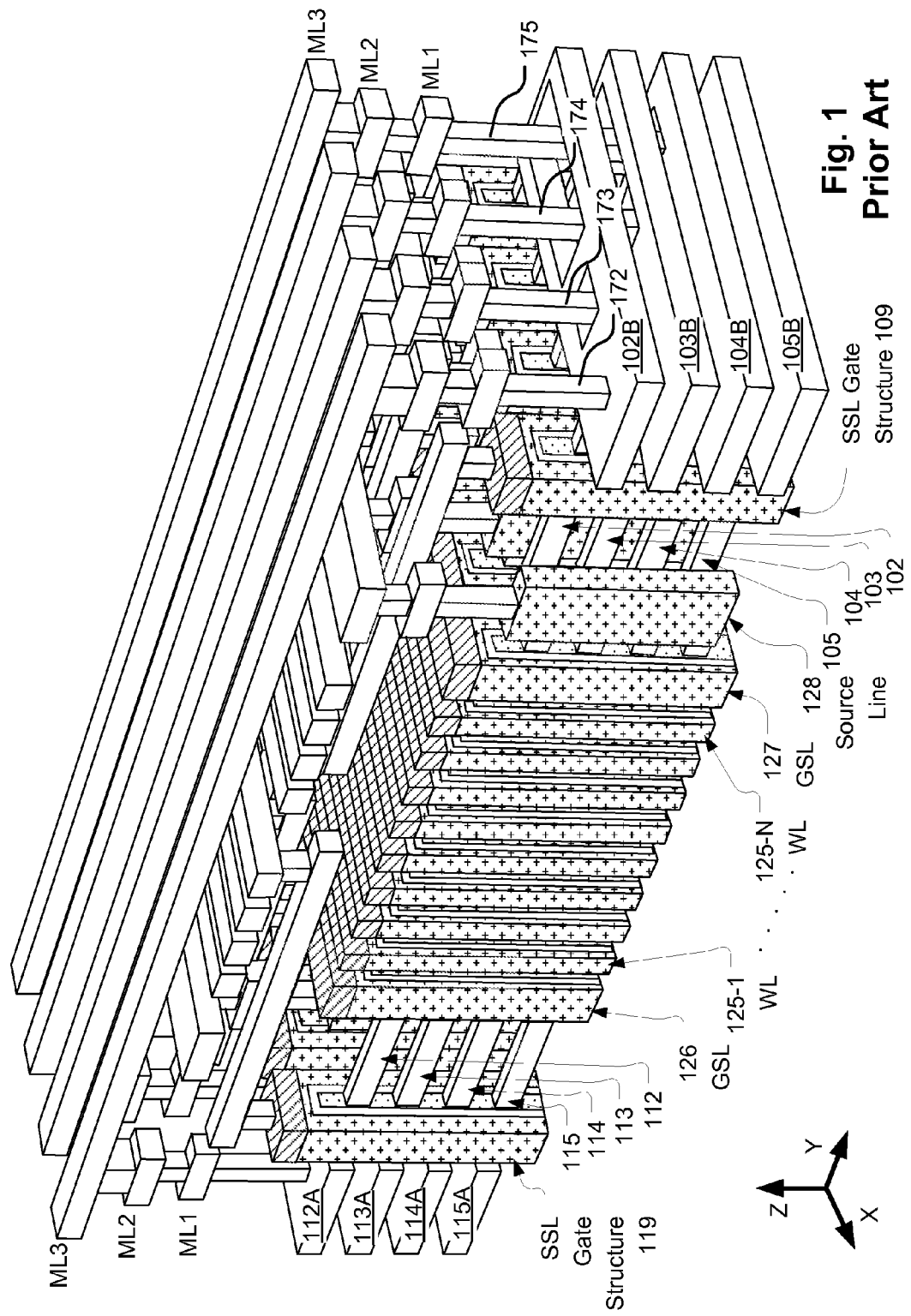
FIG. 1 is a perspective illustration of a 3D memory structure.

Lateral semiconductor strip stacks 5 and 7 can include staircase contacts that select a particular level of semiconductor material in semiconductor material strip stacks 1 and 3 for memory operations. For example, lateral semiconductor strip stacks 5 and 7 can include a staircase structure that selects a particular plane of the semiconductor material strip stacks 1 and 3. One embodiment of the staircase structure can resemble the linking elements 112A, 113A, 114A, and 115A and linking elements 102B, 103B, 104B, and 105B of FIG. 1. Other embodiments can change the order of the linking elements and alter the shapes and configuration of the linking elements. Alternatively, lateral semiconductor strip stacks 5 and 7 can electrically connect between semiconductor material strip stacks 1 and 3, and another structure that selects a particular level of semiconductor material for memory operations. Lateral semiconductor strip stacks 5 and 7 can act as bit line pads.

Source line contacts 10 and 12 connect to all layers of the semiconductor material strip stacks 1 and 3. Current flow directions are indicated by dashed arrows. For semiconductor material strips stacks 1, current flows between lateral semiconductor strip stack 5 and source line contacts 12. For semiconductor material strips stacks 3, current flows between lateral semiconductor strip stack 7 and source line contacts 10.

String select line pads 24 and 26 are positioned over and electrically connected to vertical columns of gate material vertical columns of gate material that electrically couple to all layers of the semiconductor material strip stacks 1 and 3. The vertical columns of gate material are gates to turn pass transistors on and off. Memory elements in particular stacks of semiconductor material strip stacks 1 and 3 are selected by applying a set of voltages to the string select line pads 24 and 26 that distinguishes one stack from the other stacks. String select line pads 24 allow or block current through semiconductor material strip stacks 1, between lateral semiconductor strip stack 5 and source line contacts 12. String select line pads 26 allow or block current through semiconductor material strip stacks 3, between lateral semiconductor strip stack 7 and source line contacts 10.

Memory cell NAND strings in adjacent stacks alternate between a bit line end-to-source line end orientation and a source line end-to-bit line end orientation. Stacks with one of these orientations are included in semiconductor material strip stacks 1, and stacks with the other orientation are included in semiconductor material strip stacks 3.

Ground select line 28 and ground select line 30 are arranged orthogonally over the semiconductor material strip stacks 1 and 3. Ground select line 28 and ground select line 30 are parallel to each other and to word lines 32. Ground select line 28 and ground select line 30 are positioned over and electrically connected to vertical columns of gate material that electrically couple to all layers of the semiconductor material strip stacks 1 and 3. The GSL 30 or GSL 28 is proximate to the common source line contact of a particular strip stack, and the GSL 30 or GSL 28 acts as a ground select line.

In combination, the word line signals, the bit line signals received by bit line pads, and the level select signals received by lateral semiconductor strip stacks are sufficient to identify individual memory cells in the 3D memory array.

FIGS. 3-16 are steps in an example process flow to make the 3D memory structure in FIG. 2.

FIGS. 3 and 4 are respectively side and top views of a stack of semiconductor material with oxide separating different layers of semiconductor material, in which source line contacts are formed that go through all layers of the stack of semiconductor material.

In FIG. 3, layers of polysilicon 6 alternate with layers of oxide 8. Polysilicon 6 can be a semiconductor material that serves as a body or channel for memory transistors. For example, polysilicon 6 can be p-type or n-type polysilicon, p-type or n-type silicon, or another semiconductor material. Oxide 8 can be an electrical insulator that electrically decouples adjacent layers of polysilicon 6. For example, oxide 8 can be silicon oxide, silicon nitride, or another oxide, another nitride, or another insulator. The top layer of FIG. 3 is an oxide or other electrical insulator. In FIG. 3, oxide 4 and oxide 8 are shown with different patterns for purposes of illustration although the materials may be identical (though the materials can be different).

In other examples, oxide 4 and oxide 8 can use one or more of a group consisting of P-MSQ (polymethylsilsesquioxane), SiLK, fluorine-doped oxide, carbon-doped oxide, porous oxide, and spin-on organic polymeric dielectric, where fluorine-doped oxide includes SiOF (fluorinated silicate glass), and carbon-doped oxide includes SiOC (carbonated silicate glass), black diamond, coral, and aurora. These layers can be formed in a variety of ways, including low pressure chemical vapor deposition LPCVD processes available in the art.

In FIG. 4, source line contacts 10 and 12 are formed which connect to all layers of the semiconductor material strip stacks 1 and 3. Source line contacts 10 and 12 are one of the two ends of current flow through the semiconductor material strips stacks formed later. The dashed line in FIG. 4 represents the position in FIG. 4 of the cross-sectional side view of FIG. 3.

Figure 6:
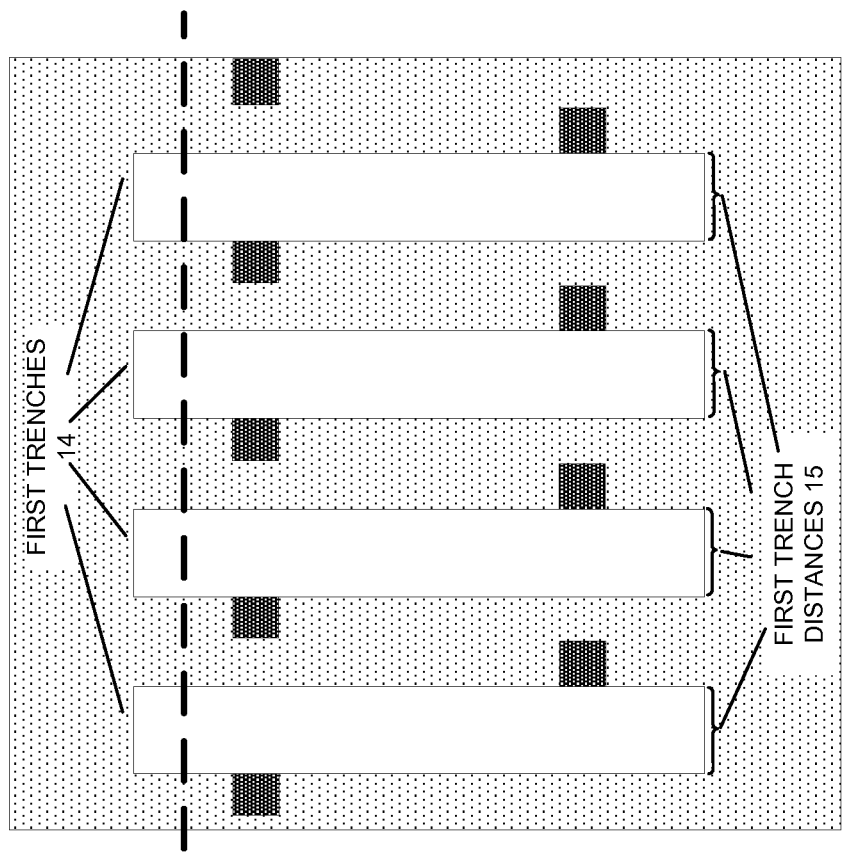
Figure 5:
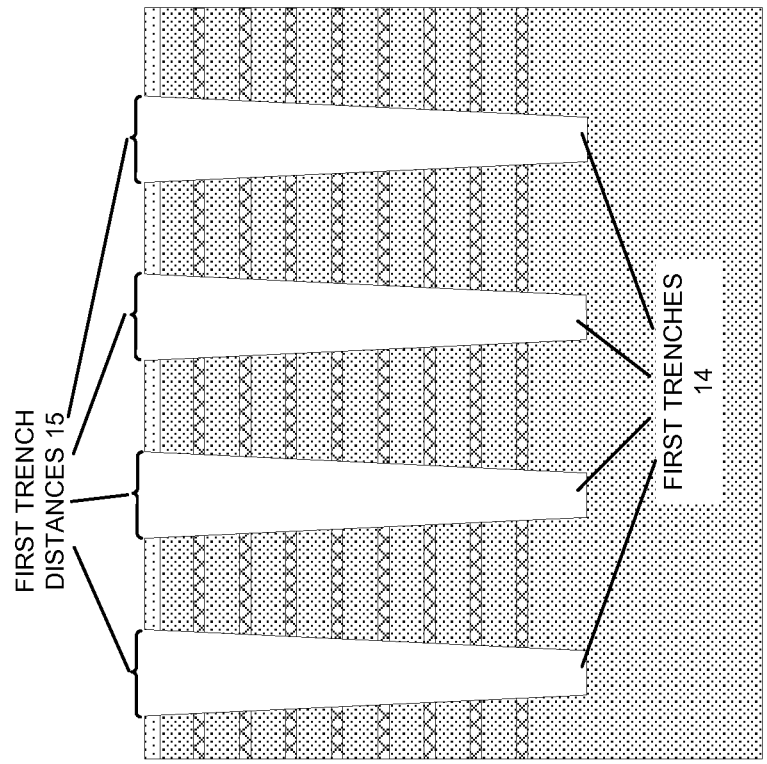

FIGS. 5 and 6 are respectively side and top views in which a first set of trenches is formed adjacent to the source line contacts, the trench openings being characterized by first trench distances.

In FIG. 5, first trenches 14 are etched from the surface through to the bottom layer of oxide 8, in a lithographic patterning step. Deep, high aspect ratio trenches can be formed, using lithography based processes applying a carbon hard mask and reactive ion etching. The first trenches 14 have openings at the surface with widths characterized by first trench distances 15. Compared to other trenches formed in a different step, the first trench distances 15 are relatively wide to accommodate the subsequent formation of nonvolatile memory materials and gate materials.

FIG. 6 shows a corresponding top view of the first trenches 14 having openings at the surface with widths characterized by first trench distances 15. The dashed line in FIG. 6 represents the position in FIG. 6 of the cross-sectional side view of FIG. 5. The first trenches 14 are formed adjacent to source line contacts. The top ends of first trenches 14 are adjacent to source line contacts on the left sides of first trenches 14. The bottom ends of first trenches 14 are adjacent to source line contacts on the right sides of first trenches 14.

Figure 8:
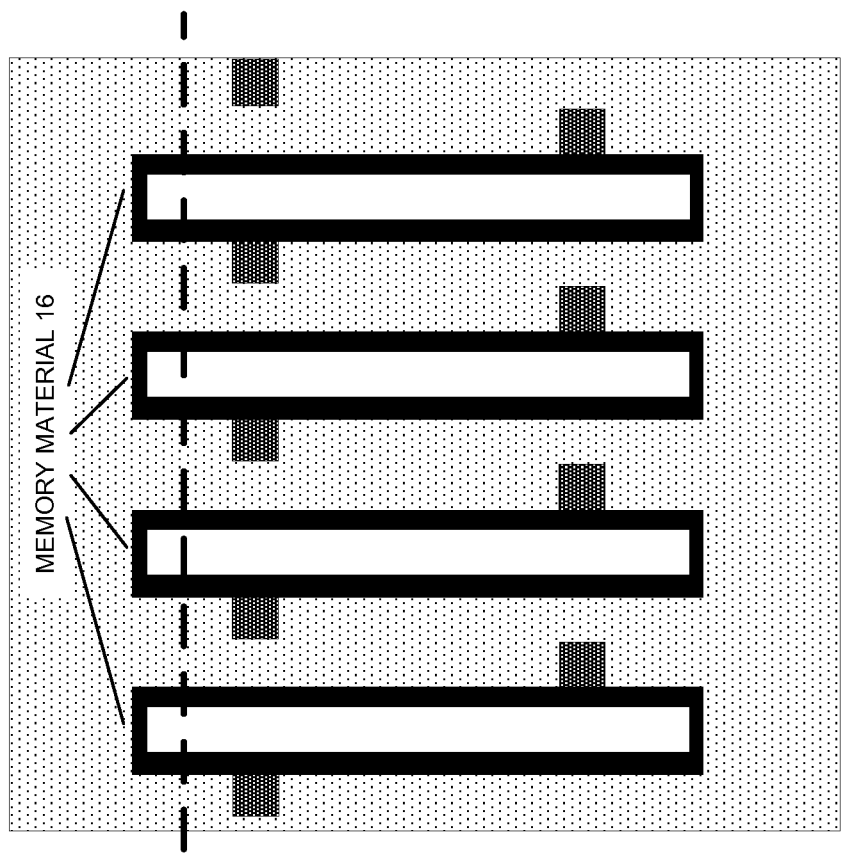
Figure 7:
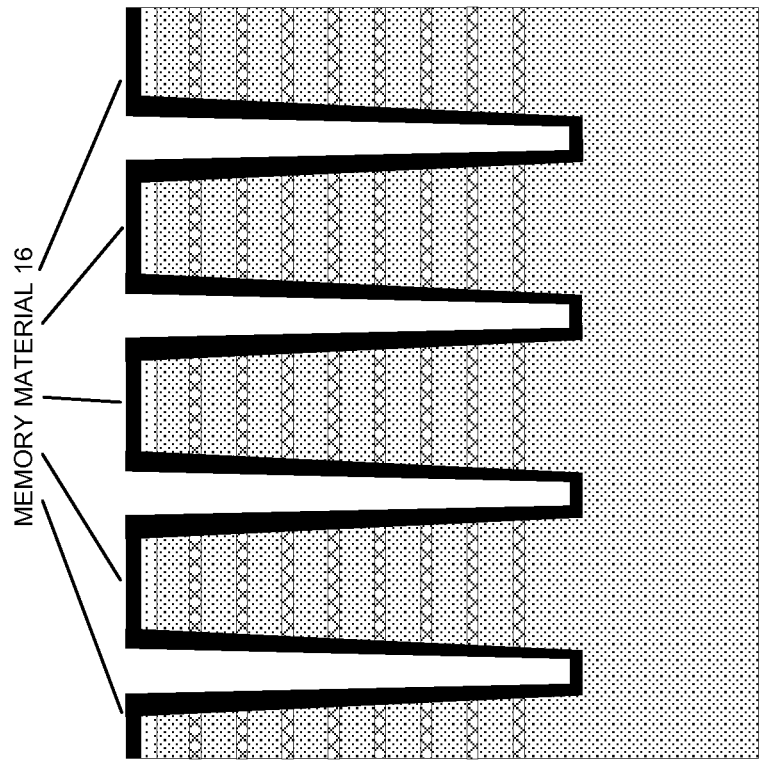

FIGS. 7 and 8 are respectively side and top views in which nonvolatile memory material is formed conformally over the trench surfaces.

In FIG. 7, memory material 16 is formed conformally over the trench surfaces of first trenches 14. Because the first trench distances 15 are relatively wide, the memory material formation is simplified. FIG. 8 shows a corresponding top view of the memory material 16 formed conformally over the trench surfaces of first trenches 14. The dashed line in FIG. 8 represents the position in FIG. 8 of the cross-sectional side view of FIG. 7.

Some embodiments of memory material 16 include a dielectric charge trapping structure. Another embodiment of memory material 16 is a multiple layer structure. A tunneling dielectric layer can be formed of silicon oxide (O), a charge storage layer 1198 can be formed of silicon nitride (N), a blocking dielectric layer 1199 can be formed of silicon oxide (O), and a gate can comprise polysilicon (S) of the word lines or vertical column of gate material.

The layer of memory material can comprise other charge storage structures. For example, a bandgap engineered SONOS (BE-SONOS) charge storage structure can be used which includes a dielectric tunneling layer that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer this embodiment comprises silicon dioxide on the side surface of the semiconductor strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

In a representative device, the layer of memory material includes a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

A charge trapping layer of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer of memory material in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD $SiO_2$. Other blocking dielectrics can include high-K materials like aluminum oxide.

In another representative embodiment, the hole tunneling layer can be 13 Å of silicon dioxide; the band offset layer can be 20 Å of silicon nitride; the isolation layer can be 25 Å of silicon dioxide; the charge trapping layer can be 70 Å of silicon nitride; and the blocking dielectric layer can be silicon oxide 90 Å thick. The gate material of the word line or vertical column of gate material is p+ polysilicon (work function about 5.1 eV).

Figure 10:
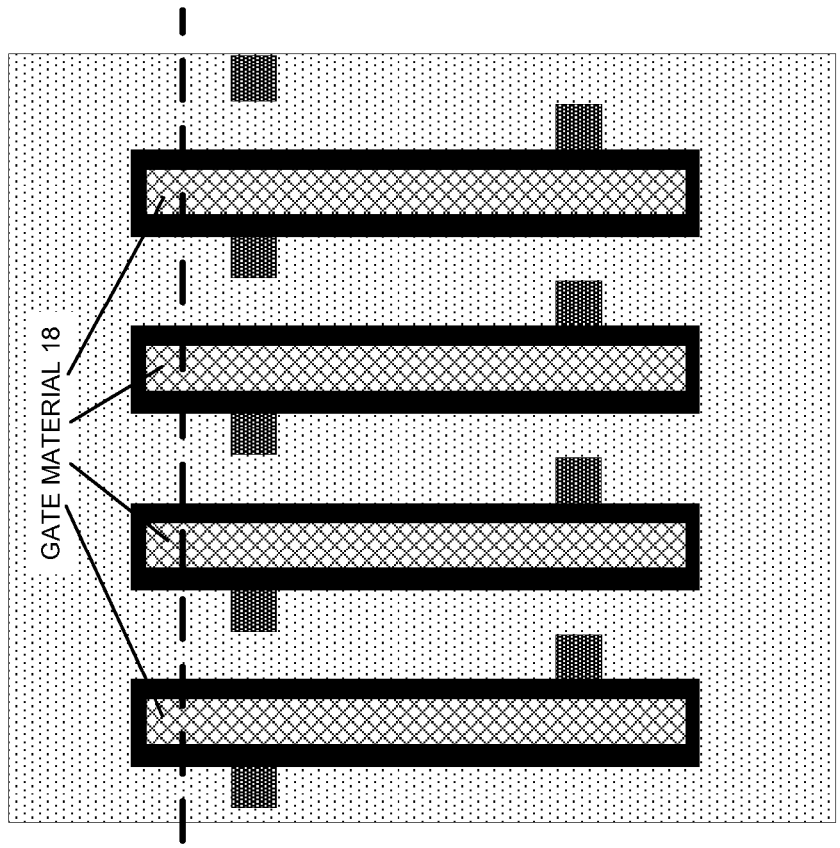
Figure 9:
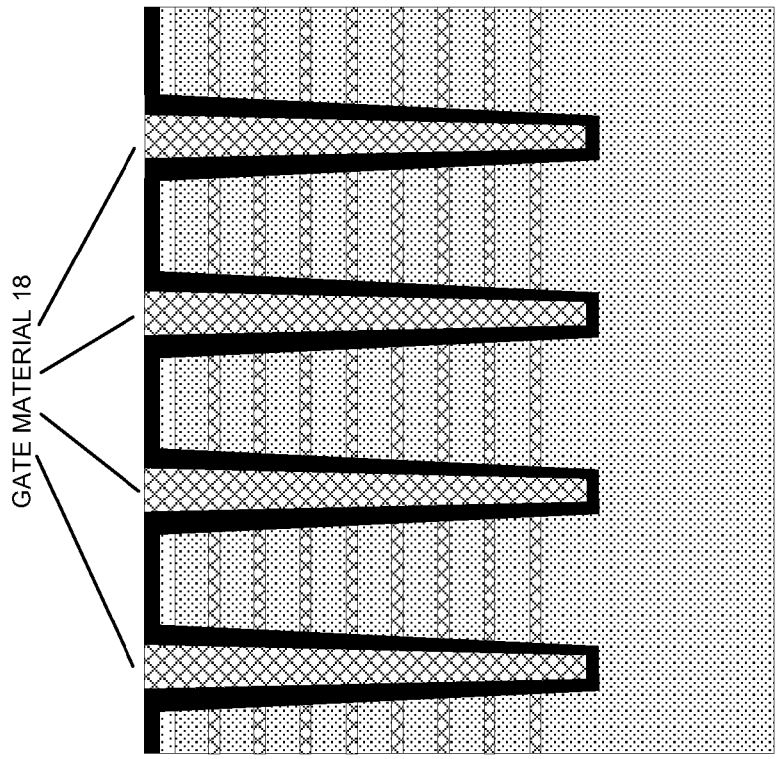

FIGS. 9 and 10 are respectively side and top views in which conductive gate material fills the trenches, covering the nonvolatile memory material in the trenches.

In FIG. 9, gate material 18 is formed conformally over the memory material 16 to fill first trenches 14. Because the first trench distances 15 are relatively wide, the fill-in is simplified.

FIG. 10 shows a corresponding top view of the gate material 18 formed conformally over the memory material 16 to fill first trenches 14. The dashed line in FIG. 10 represents the position in FIG. 10 of the cross-sectional side view of FIG. 9.

The gate material can include semiconductor material which can be used in semiconductor material strip stacks 1 and 3, or other conductive material such as a metal. A vertical column of gate material can act as the gate for the memory devices in the vertically stacked semiconductor strips on both sides of the strip-shaped vertical column of gate material.

Figure 12:
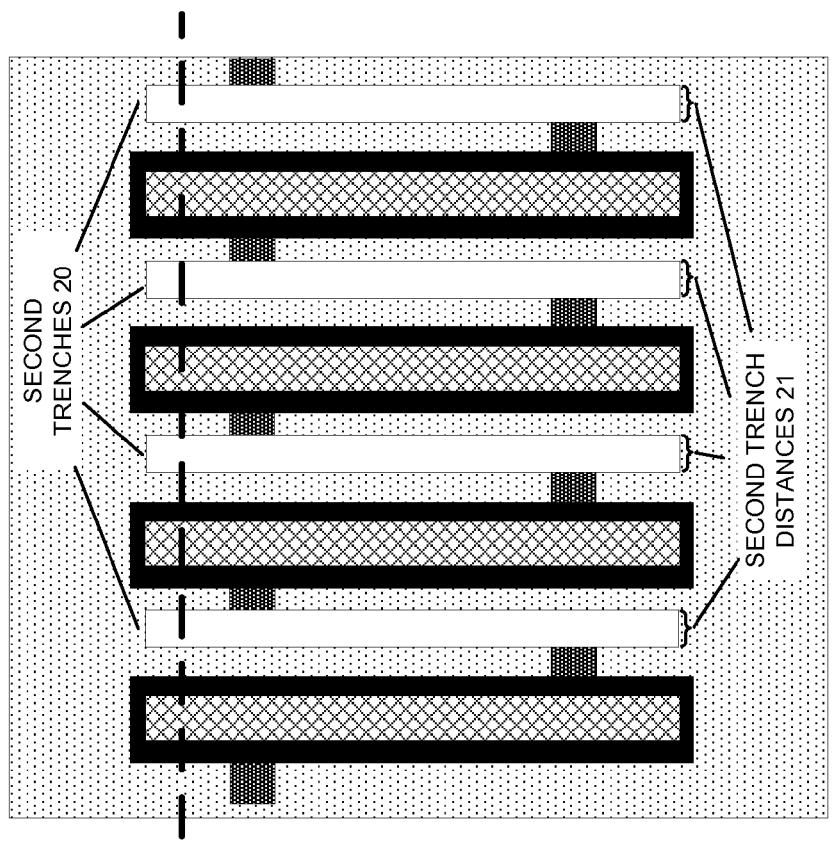
Figure 11:
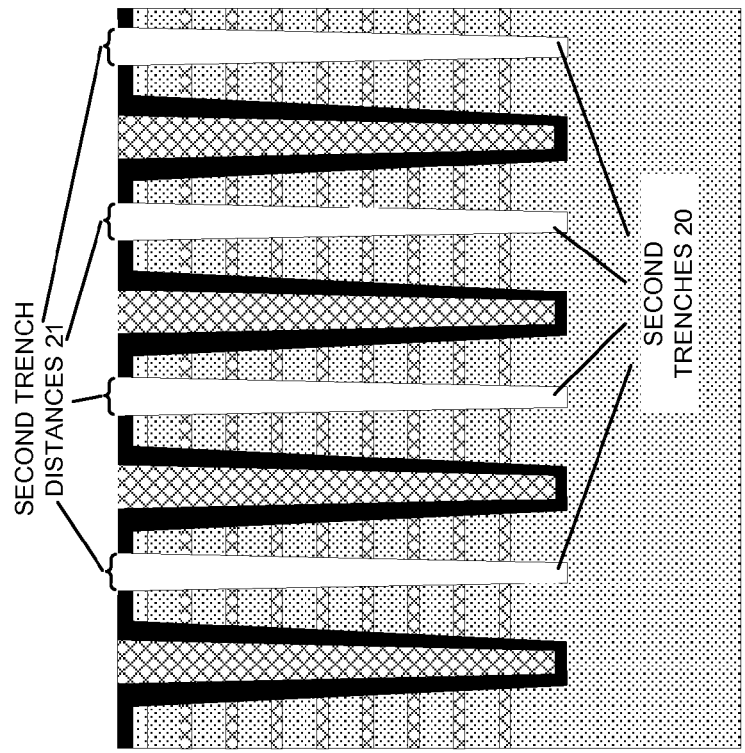

FIGS. 11 and 12 are respectively side and top views in which a second set of trenches is formed to interlace with the first set of trenches, the trench openings being characterized by second trench distances narrower than the first trench distances characterizing the trench openings of the first set of trenches.

In FIG. 11, second trenches 20 are etched from the surface through to the bottom layer of oxide 8, in a lithographic patterning step. Deep, high aspect ratio trenches can be formed, using lithography based processes applying a carbon hard mask and reactive ion etching. The second trenches 20 have openings at the surface with widths characterized by second trench distances 21. Compared to other trenches formed in a different step, the second trench distances 21 are relatively narrow to accommodate the subsequent filling of oxide. The second trench distances 21 can be relatively narrow because they do not have to accommodate the formation of nonvolatile memory materials and gate materials.

The first trenches 14 have a first pitch. The second trenches 20 have a second pitch. A combined set of trenches including the first trenches 14 and the second trenches has 20 a second pitch equal to half of the first pitch.

FIG. 12 shows a corresponding top view of the second trenches 20 having openings at the surface with widths characterized by second trench distances 21. The dashed line in FIG. 12 represents the position in FIG. 12 of the cross-sectional side view of FIG. 11. The second trenches 20 are formed adjacent to source line contacts. The top ends of second trenches 20 are adjacent to source line contacts on the right sides of second trenches 20. The bottom ends of second trenches 20 are adjacent to source line contacts on the left sides of second trenches 20.

Figure 14:
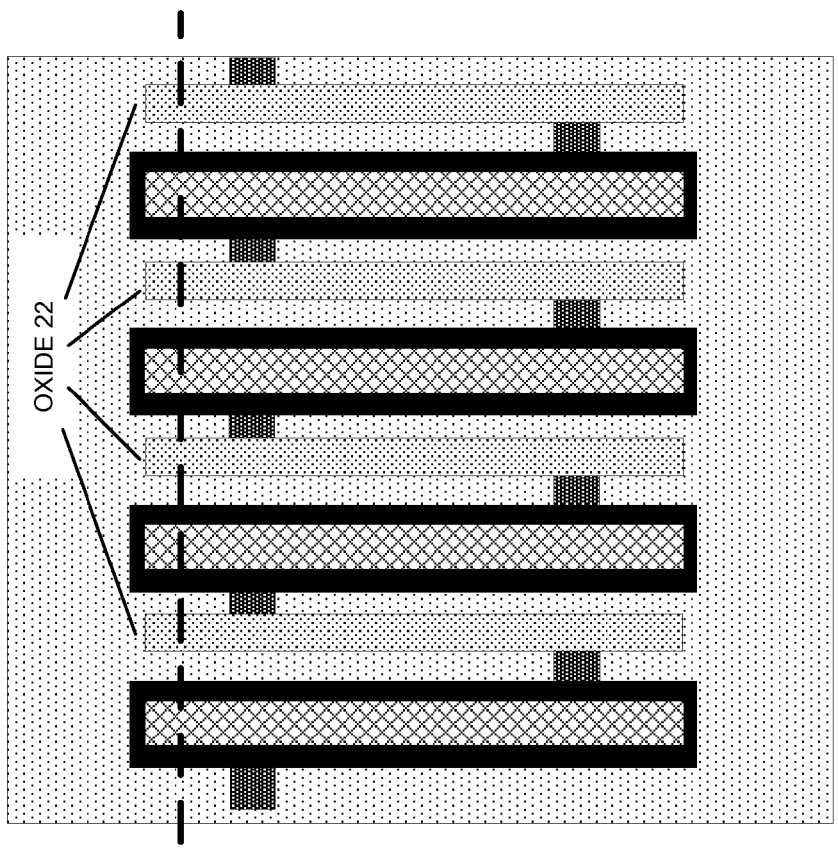
Figure 13:
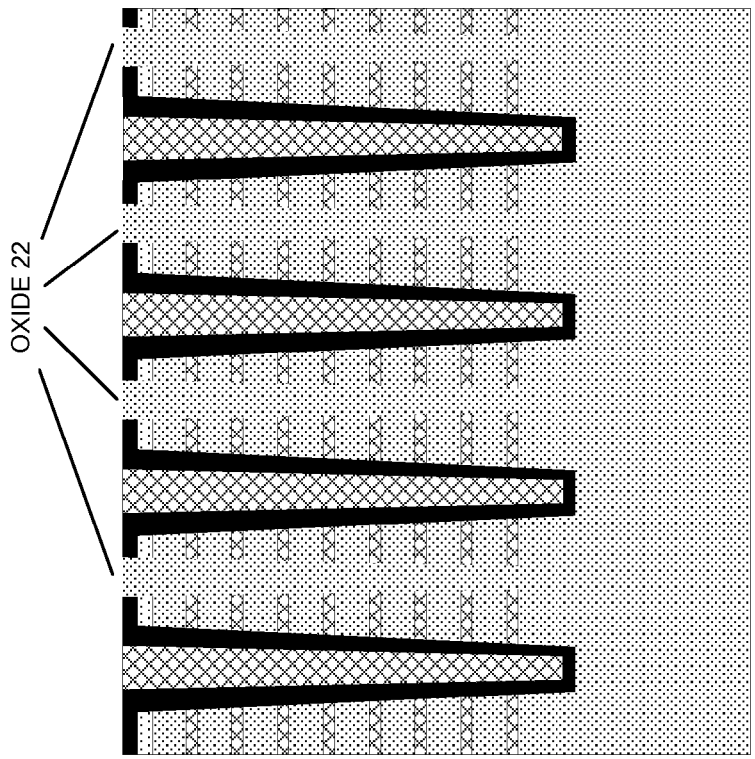

FIGS. 13 and 14 are respectively side and top views in which the second set of trenches is filled with oxide.

In FIG. 13, oxide 22 fills second trenches 20. FIG. 14 shows a corresponding top view of the oxide 22 filling second trenches 20. The dashed line in FIG. 14 represents the position in FIG. 14 of the cross-sectional side view of FIG. 13. Oxide 22 can be an electrical insulator that electrically decouples adjacent stacks of semiconductor strips. For example, oxide 22 can be silicon oxide, silicon nitride, or another oxide, another nitride, or another insulator.

Figure 16:
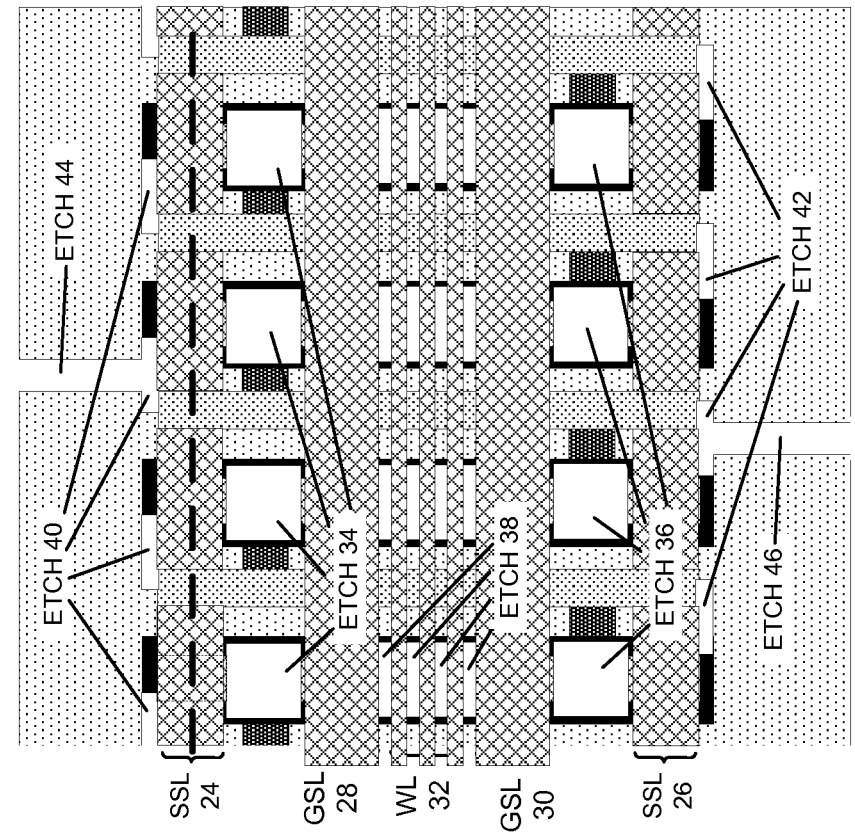
Figure 15:
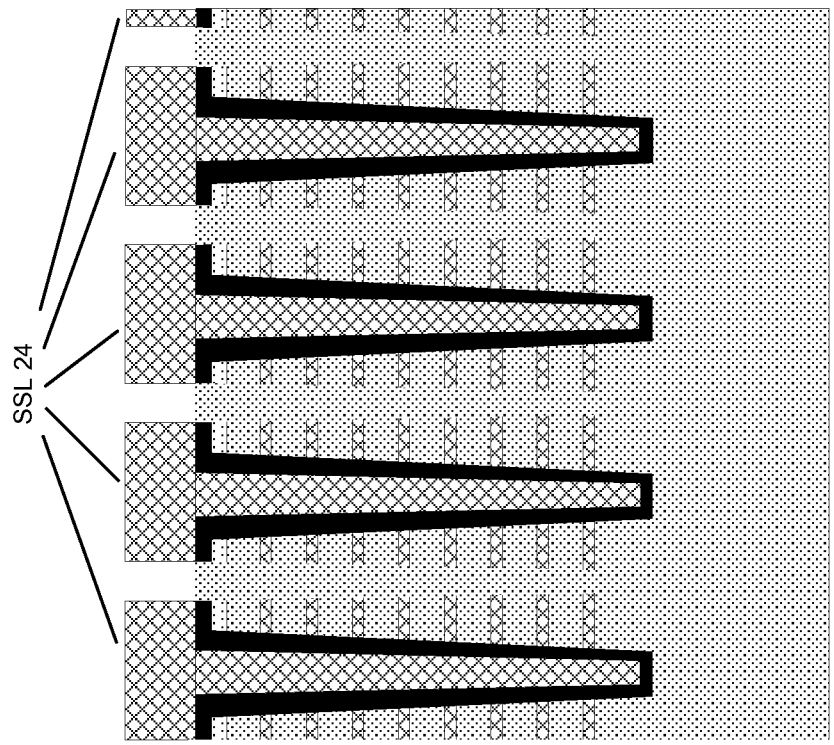

FIGS. 15 and 16 are respectively side and top views in which bit line pads, word lines, and ground select/string select lines, are formed orthogonally over the stacks of semiconductor material.

In FIG. 15, string select line pads 24 are formed over the gate material 18. Subsequently, metal lines carrying the bit line signals can be routed to the string select line pads 24. A metal line is etched over the oxide 22, leaving discrete string select line pads 24. The etching pitch is relatively large, because the discrete string select line pads 24 can cover two semiconductor strip stacks, though the discrete string select line pads 24 each control only one semiconductor strip stack. FIG. 16 shows a corresponding top view of the string select line pads 24 formed over the gate material 18. The dashed line in FIG. 16 represents the position in FIG. 16 of the cross-sectional side view of FIG. 15. FIG. 16 also shows string select line pads 26; GSL 28 and GSL 30 lines; and WL lines 32 being formed over the gate material 18.

String select line pads 24, 26; GSL 28 and GSL 30 lines; and WL lines 32 can also include gate material which can be semiconductor material used in semiconductor material strip stacks 1 and 3, or other conductive material such as a metal.

FIG. 16 also shows etch spaces to electrically separate parts of the memory array. Etches 40 and 42 electrically separate semiconductor material strip stacks 1 and 3 from lateral semiconductor strip stack 5 or 7. As a result, current in each stack of semiconductor material strip stacks 1 and 3 flows between one of the lateral semiconductor strip stack 5 or 7, and one of the source line contacts.

Etches 34, 36, and 38 electrically separate adjacent lines of the GSL 28 and GSL 30 lines; and WL lines 32. Etches 34, 36, and 38 also electrically separate gate material 18 from individual long strip shaped vertical columns into multiple short vertical columns. The multiple short vertical columns are electrically isolated from each other, such that the multiple short vertical columns can be electrically discrete gates.

Etches 44 and 46 electrically isolate the 3D array into multiple units that can be separately addressed by different sets of signals.

Figure 17:
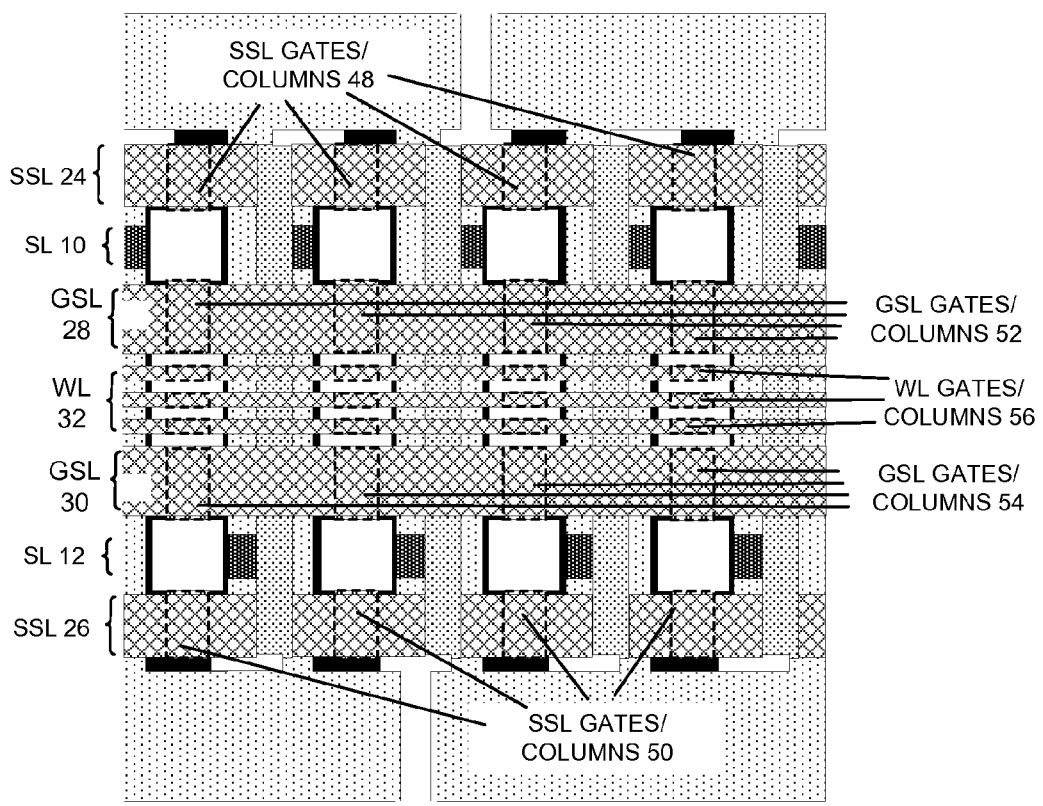
FIG. 17 is a top view of the vertical gate 3D memory structure, with dashed lines indicating the vertical columns of gate material electrically coupled to the word lines, string select lines, ground select lines, and bit line pads.
Figure 18:
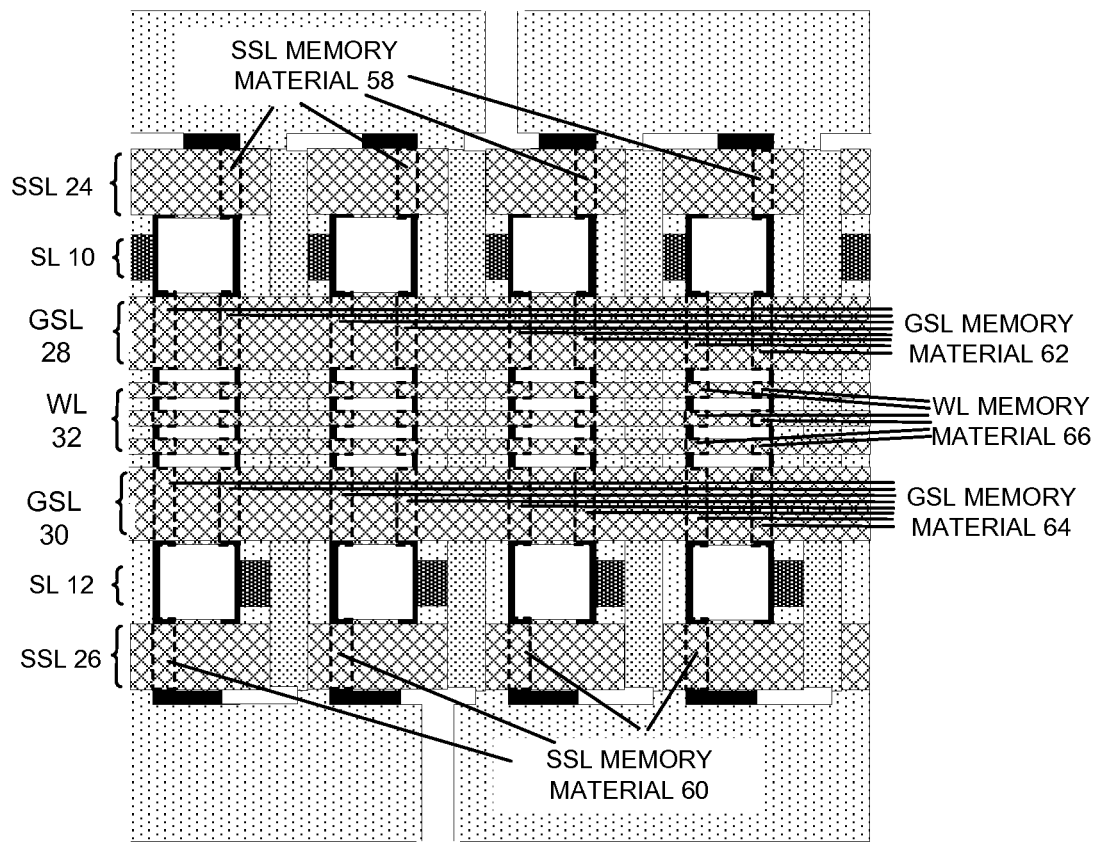
FIG. 18 is a top view of the vertical gate 3D memory structure, with dashed lines indicating the memory material corresponding to the memory cells controlled by the word lines, string select lines, ground select lines, and bit line pads.
Figure 19:
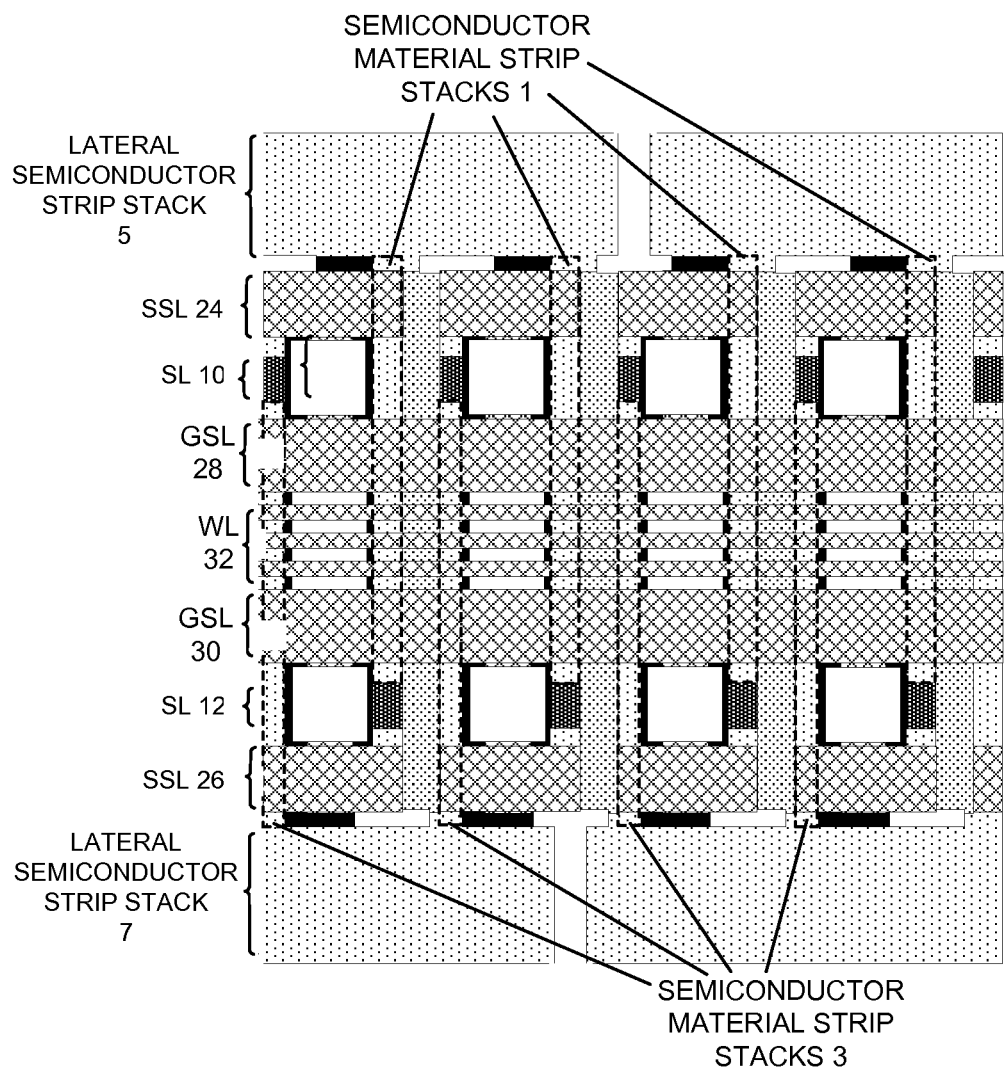
FIG. 19 is a top view of the vertical gate 3D memory structure, with dashed lines indicating the semiconductor material strip stacks corresponding to the channel of the NAND strings.

FIGS. 17-19 indicate different parts of memory transistors which in combination form memory transistors, which are partly obscured by overlying string select line pads 24 and 26, GSL lines 28, GSL lines 30, and WL lines 32. The different parts in combination form memory transistors.

FIG. 17 is a top view of the vertical gate 3D memory structure, with dashed lines indicating the vertical columns of gate material electrically coupled to the word lines, string select lines, ground select lines, and bit line pads. The vertical columns of gate material are single side gates for the memory transistors. String select line gates/columns 48 and 50 are single side gates for the transistors controlled by string select line pads 24 and 26. GSL gates/columns 52 are single side gates for the transistors controlled by GSL lines 28. GSL gates/columns 54 are single side gates for the transistors controlled by GSL lines 30. WL gates/columns 56 are single side gates for the memory transistors controlled by WL lines 32.

FIG. 18 is a top view of the vertical gate 3D memory structure, with dashed lines indicating the memory material corresponding to the memory cells controlled by the word lines, string select lines, ground select lines, and bit line pads. The memory material are nonvolatile memory elements for the memory transistors. Memory elements associated with pass transistors not accessed by word lines can be unused or removed and replaced with non-memory material. String select line memory material 58 and 60 has nonvolatile memory elements for the transistors controlled by string select line pads 24 and 26. GSL memory material 62 has nonvolatile memory elements for the transistors controlled by GSL lines 28. GSL memory material 64 has nonvolatile memory elements for the transistors controlled by GSL lines 30. WL memory material 66 has nonvolatile memory elements for the memory transistors controlled by WL lines 32.

FIG. 19 is a top view of the vertical gate 3D memory structure, with dashed lines indicating the semiconductor material strip stacks corresponding to the channel of the NAND strings. Semiconductor material strip stacks 1 are the body and channel for NAND strings of nonvolatile memory cells between lateral semiconductor strip stack 5 and source line contacts 12. Semiconductor material strip stacks 3 are the body and channel for NAND strings of nonvolatile memory cells between lateral semiconductor strip stack 7 and source line contacts 10.

Figure 20:
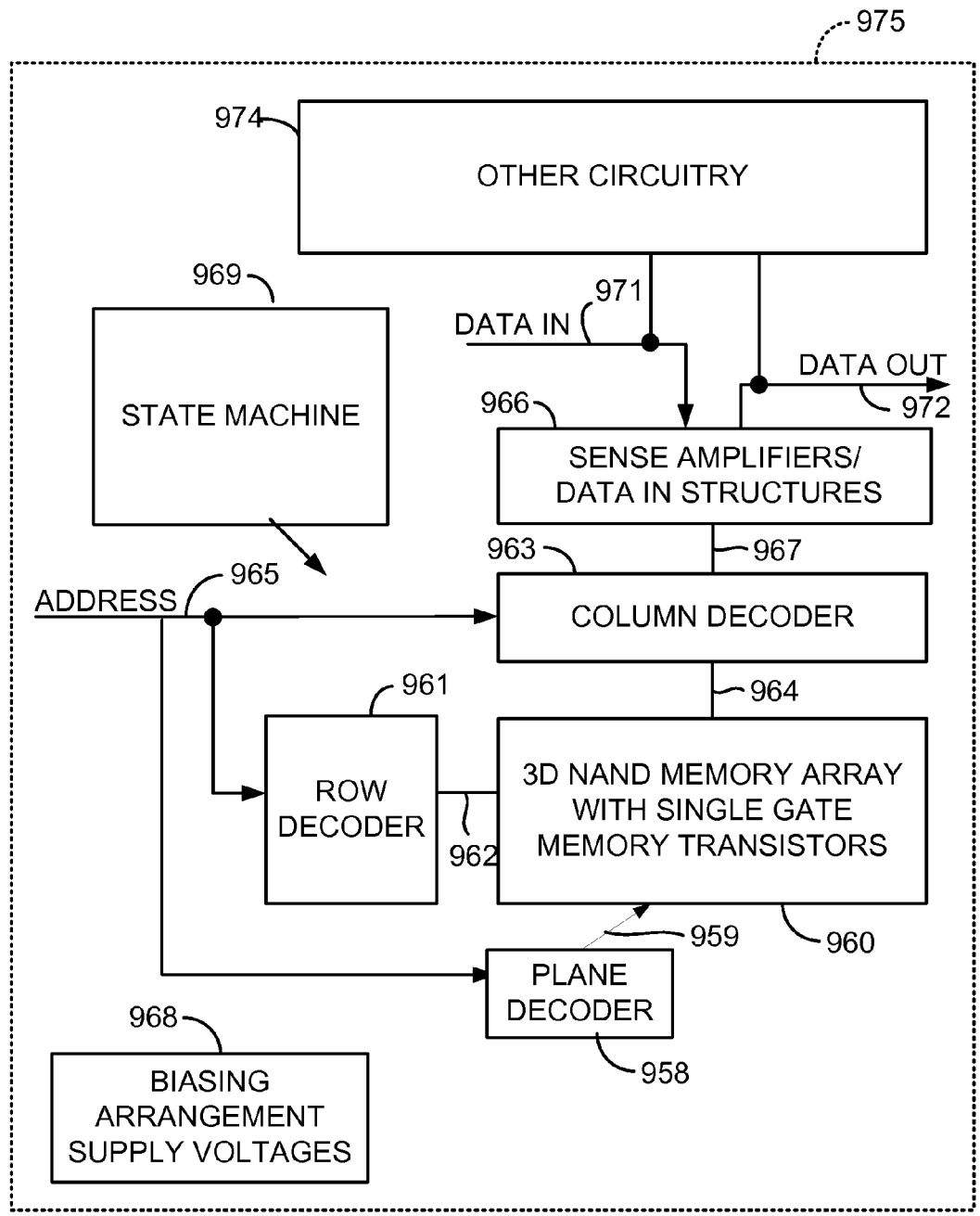
FIG. 20 is a schematic diagram of an integrated circuit including a vertical gate 3D memory structure with stacked NAND strings of nonvolatile memory cells having vertically stacked semiconductor strips.

FIG. 20 is a schematic diagram of an integrated circuit including a vertical gate 3D memory structure with stacked NAND strings of nonvolatile memory cells having vertically stacked semiconductor strips.

The integrated circuit line 975 includes a 3D NAND flash memory array 960, implemented as described herein, on a semiconductor substrate with single gate transistors and different sets of distances separating adjacent stacks of semiconductor material strips. A row decoder 961 is coupled to a plurality of word lines 962, and arranged along rows in the memory array 960. A column decoder 963 is coupled to a plurality of bit lines 964 arranged along columns corresponding to stacks in the memory array 960 for reading and programming data from the memory cells in the array 960. A plane decoder 958 is coupled to a plurality of planes in the memory array 960 via string select lines 959. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller sends signals to the plane decoder 958 which send a set of voltages to the string select lines 959.

The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a nonvolatile memory array, comprising:
    forming a plurality of layers of a semiconductor material alternating with insulating layers on a substrate;
    etching the plurality of layers to define a first plurality of trenches and a second plurality of trenches, the first plurality of trenches formed in a first patterned etch and the second plurality of trenches formed in a second patterned etch defining a plurality of stacks of strips of the semiconductor material, the first plurality of trenches interleaved with the second plurality of trenches, a first width of the first plurality of trenches being wider than a second width of the second plurality of trenches;
    forming, in the first plurality of trenches and not in the second plurality of trenches, a conformal layer of nonvolatile memory material that stores data as part of nonvolatile memory cells in the nonvolatile memory array;
    forming, in the first plurality of trenches, a plurality of vertical columns of conductive gate material that are gates to stacks of the plurality of stacks on first and second opposite sides of trenches of the first plurality of trenches; and
    forming a plurality of word lines orthogonally over the plurality of stacks of strips, the plurality of word lines electrically coupled with the plurality of vertical columns, establishing memory cells for a plurality of vertically stacked NAND strings.

2. The method of claim 1, further comprising:
    filling the second plurality of trenches with insulating material that electrically separates stacks of the plurality of stacks on first and second opposites sides of trenches of the second plurality of trenches.

3. The method of claim 1, wherein forming the plurality of vertical columns includes:
    after forming the nonvolatile memory material in the first plurality of trenches, filling the first plurality of trenches with conductive gate material; and
    removing excess parts of the conductive gate material from the first plurality of trenches to form the plurality of vertical columns.

4. The method of claim 1, wherein said etching includes:
    etching the first plurality of trenches and etching the second plurality of trenches in different etches.

5. The method of claim 1, wherein the first plurality of trenches has a first pitch, the second plurality of trenches has the first pitch, and a combined plurality of trenches including the first plurality of trenches and the second plurality of trenches has a second pitch equal to half of the first pitch.

6. A memory device comprising:
    a plurality of stacks of semiconductor strips, stacks in the plurality having opposite sides including a first side and a second side, and being separated from an adjacent stack on one side of the first and second sides by a first trench having a first width and separated from an adjacent stack on the opposite side by a second trench having a second width, the second width being less than the first width;
    a conformal layer of memory material on side walls of the first trenches, and not the second trenches;
    a plurality of word lines arranged orthogonally over the plurality of stacks of semiconductor strips;
    a plurality of vertical columns of conductive gate material electrically coupled to the plurality of word lines, wherein:
        vertical columns in the plurality of vertical columns and memory material of the conformal layer at cross points between the vertical columns and conductive strips are disposed in the first trench and not in the second trench, and wherein vertical columns in the plurality of vertical columns disposed in the first trench are gates to the adjacent stacks in the plurality of stacks of semiconductor strips, establishing memory cells along the strips in the stacks.

7. The memory device of claim 6, wherein distances in the first trenches separating strips in a given level in adjacent stacks are greater than distances in the second trenches separating the strips in a given level in adjacent stacks.

8. The memory device of claim 7, wherein the second trenches are occupied by insulating material that electrically separates stacks of the plurality of stacks.

9. The memory device of claim 6, wherein the memory material is a dielectric charge trapping memory material.

10. The memory device of claim 6, wherein the memory cells on the strips are configured as NAND strings, and NAND strings in the strips in adjacent stacks include NAND strings of opposite orientations, the opposite orientations including a first orientation of bit line-to-source line and a second orientation of source line-to-bit line.

11. The memory device of claim 6, wherein the array comprises a vertical gate NAND array.

12. The memory device of claim 6, further comprising:
control circuitry that performs memory operations on memory cells distinguished by: (i) a particular strip layer in the plurality of stacks of semiconductor strips, (ii) a particular position along a strip of the vertically stacked semiconductor strips, and (iii) a particular stack in the plurality of stacks.

13. The memory device of claim 6, further comprising:
a first lateral stack of semiconductor strips connected to first ends of the stacks of semiconductor strips; and
a second lateral stack of semiconductor strips connected to second ends of the stacks of semiconductor strips.

14. The memory device of claim 13, wherein
the first lateral stack of semiconductor strips is disconnected from second ends of alternate ones of the stacks of semiconductor strips; and
the second lateral stack of semiconductor strips is connected from first ends of the others of the stacks of semiconductor strips.

15. The memory device of claim 13, further comprising:
a first plurality of bit line pads between the plurality of word lines and one of the first lateral stack of semiconductor strips and the second lateral stack of semiconductor strips.

16. The memory device of claim 15, further comprising:
control circuitry that distinguishes memory cells in one of the vertically stacked semiconductor strips by applying a bias arrangement to the first plurality of bit line pads.

17. A memory device comprising:
a plurality of stack structures having semiconductor strips;
the plurality of stack structures separated from each other by a plurality of trenches;
the plurality of trenches comprising first trenches and second trenches, the first trenches and second trenches arranged alternatively;
the first trenches including conducting material and the second trenches being filled with insulating material; and
memory material disposed conformally on the sidewalls of a plurality of stack structures in the first trenches and not the second trenches.

* * * * *